(12) United States Patent
Liu et al.

(10) Patent No.: US 10,609,835 B1
(45) Date of Patent: Mar. 31, 2020

(54) ELECTRONIC DEVICE AND DRIVING MECHANISM

(71) Applicant: Wistron Corporation, New Taipei (TW)

(72) Inventors: Qi Liu, New Taipei (TW); Zhaoping Fu, New Taipei (TW)

(73) Assignee: Wistron Corporation, New Taipei (TW)

( * ) Notice: Subject to any disclaimer, the term of this patent is extended or adjusted under 35 U.S.C. 154(b) by 0 days.

(21) Appl. No.: 16/205,169

(22) Filed: Nov. 29, 2018

(30) Foreign Application Priority Data

Sep. 25, 2018 (CN) .......................... 2018 1 1115017

(51) Int. Cl.
| | |
|---|---|
| *H05K 7/14* | (2006.01) |
| *F16H 21/44* | (2006.01) |
| *F16H 7/02* | (2006.01) |
| *F16H 19/04* | (2006.01) |

(52) U.S. Cl.
CPC ............. *H05K 7/1489* (2013.01); *F16H 7/02* (2013.01); *F16H 19/04* (2013.01); *F16H 21/44* (2013.01)

(58) Field of Classification Search
CPC ............ F16H 7/02; F16H 19/04; F16H 21/44; H05K 7/1489
See application file for complete search history.

(56) References Cited

U.S. PATENT DOCUMENTS

| 6,685,489 | B1 * | 2/2004 | Rubenstein | .......... | H05K 7/1409 |
| | | | | | 439/157 |
| 7,215,556 | B2 * | 5/2007 | Wrycraft | .............. | H05K 7/1409 |
| | | | | | 361/741 |
| 7,297,015 | B1 * | 11/2007 | Desrosiers | ........... | H05K 7/1402 |
| | | | | | 361/755 |
| 7,364,447 | B1 * | 4/2008 | Desrosiers | .............. | G06F 1/186 |
| | | | | | 439/157 |
| 2006/0014407 | A1 * | 1/2006 | Wahler | ................... | G06K 13/08 |
| | | | | | 439/159 |

(Continued)

FOREIGN PATENT DOCUMENTS

| CN | 103068204 A | 4/2013 |
| TW | 201516883 | 5/2015 |

(Continued)

*Primary Examiner* — Hoa C Nguyen
*Assistant Examiner* — Keith DePew
(74) *Attorney, Agent, or Firm* — Winston Hsu

(57) ABSTRACT

An electronic device includes a chassis, an electronic component and a driving mechanism. The chassis includes a side plate. The driving mechanism includes a first linking member, an actuating member, a restraining member, a second linking member, a driving module and a support member. The actuating member is pivotally connected to the first linking member. The second linking member is pivotally connected to the side plate and the restraining member. The driving module is connected to the first linking member. The support member is connected to the driving module. The electronic component is disposed on the support member. The support member is restrained by the restraining member. The actuating member drives the second linking member to rotate with respect to the restraining member and the second linking member drives the restraining member to move, such that the restraining member is disengaged from the support member.

20 Claims, 8 Drawing Sheets

(56) References Cited

U.S. PATENT DOCUMENTS

| | | | | |
|---|---|---|---|---|
| 2011/0279973 A1* | 11/2011 | Terwilliger | .......... | H05K 7/1489 |
| | | | | 361/679.58 |
| 2012/0240704 A1* | 9/2012 | Li | ......... | H05K 7/1409 |
| | | | | 74/412 R |
| 2014/0254086 A1* | 9/2014 | Li | .......... | H01R 13/62944 |
| | | | | 361/679.32 |
| 2015/0118884 A1* | 4/2015 | Hu | ......... | H04B 1/3816 |
| | | | | 439/310 |
| 2015/0156911 A1* | 6/2015 | Hu | .......... | G06K 13/0806 |
| | | | | 361/754 |
| 2015/0230353 A1* | 8/2015 | Canfield | .......... | H05K 7/1417 |
| | | | | 403/322.4 |
| 2018/0332729 A1* | 11/2018 | Kapoor | ........ | H05K 7/1489 |

FOREIGN PATENT DOCUMENTS

| | | |
|---|---|---|
| TW | 201521544 | 6/2015 |
| TW | 201742528 A | 12/2017 |

* cited by examiner

ELECTRONIC DEVICE AND DRIVING MECHANISM

BACKGROUND OF THE INVENTION

1. Field of the Invention

The invention relates to an electronic device and a driving mechanism and, more particularly, to a driving mechanism capable of being operated easily and an electronic device equipped with the driving mechanism.

2. Description of the Prior Art

As technology advances and develops, various electronic devices (e.g. computer, server, etc.) are considered a necessity by a lot of people in their daily lives. To provide various functions for the electronic device, the electronic device usually has a plurality of expansion slots therein for installing a plurality of interface cards such as link control card (LCC), sound card, graphics card, network card and so on, so as to enhance additional functions. In general, there are various electronic components installed in a casing of the electronic device and the electronic components occupy much space of the casing. Accordingly, how to attach or detach the interface card in a limited space conveniently and rapidly becomes a significant design issue.

SUMMARY OF THE INVENTION

The invention provides a driving mechanism capable of being operated easily and an electronic device equipped with the driving mechanism, so as to solve the aforesaid problems.

According to an embodiment of the invention, an electronic device comprises a chassis, an electronic component and a driving mechanism. The chassis comprises a side plate and the driving mechanism is disposed on the side plate. The driving mechanism comprises a first linking member, an actuating member, a restraining member, a second linking member, a driving module and a support member. The actuating member is pivotally connected to the first linking member. The second linking member is pivotally connected to the side plate and the restraining member. The driving module is connected to the first linking member. The support member is connected to the driving module. The electronic component is disposed on the support member. The support member is restrained by the restraining member. The actuating member drives the second linking member to rotate with respect to the restraining member and the second linking member drives the restraining member to move, such that the restraining member is disengaged from the support member.

According to another embodiment of the invention, a driving mechanism comprises a first linking member, an actuating member, a restraining member, a second linking member, a driving module and a support member. The actuating member is pivotally connected to the first linking member. The second linking member is pivotally connected to the restraining member. The driving module is connected to the first linking member. The support member is connected to the driving module. The support member is restrained by the restraining member. The actuating member drives the second linking member to rotate with respect to the restraining member and the second linking member drives the restraining member to move, such that the restraining member is disengaged from the support member.

As mentioned in the above, after assembling the driving mechanism of the invention, the support member is restrained by the restraining member, such that the support member and the electronic component (e.g. interface card) disposed on the support member are fixed and cannot move. When a user wants to attach or detach the electronic component, the user rotates the actuating member. At this time, the actuating member drives the second linking member to rotate and the second linking member drives the restraining member to move, such that the restraining member is disengaged from the support member. Then, the user presses the actuating member downwardly, such that the actuating member drives the first linking member to move. At this time, the first linking member actuates the driving module, such that the driving module drives the support member to move to a user operable region (e.g. a region over the chassis or a region with large space). Accordingly, the user can attach/detach the electronic component to/from the support member conveniently and rapidly.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
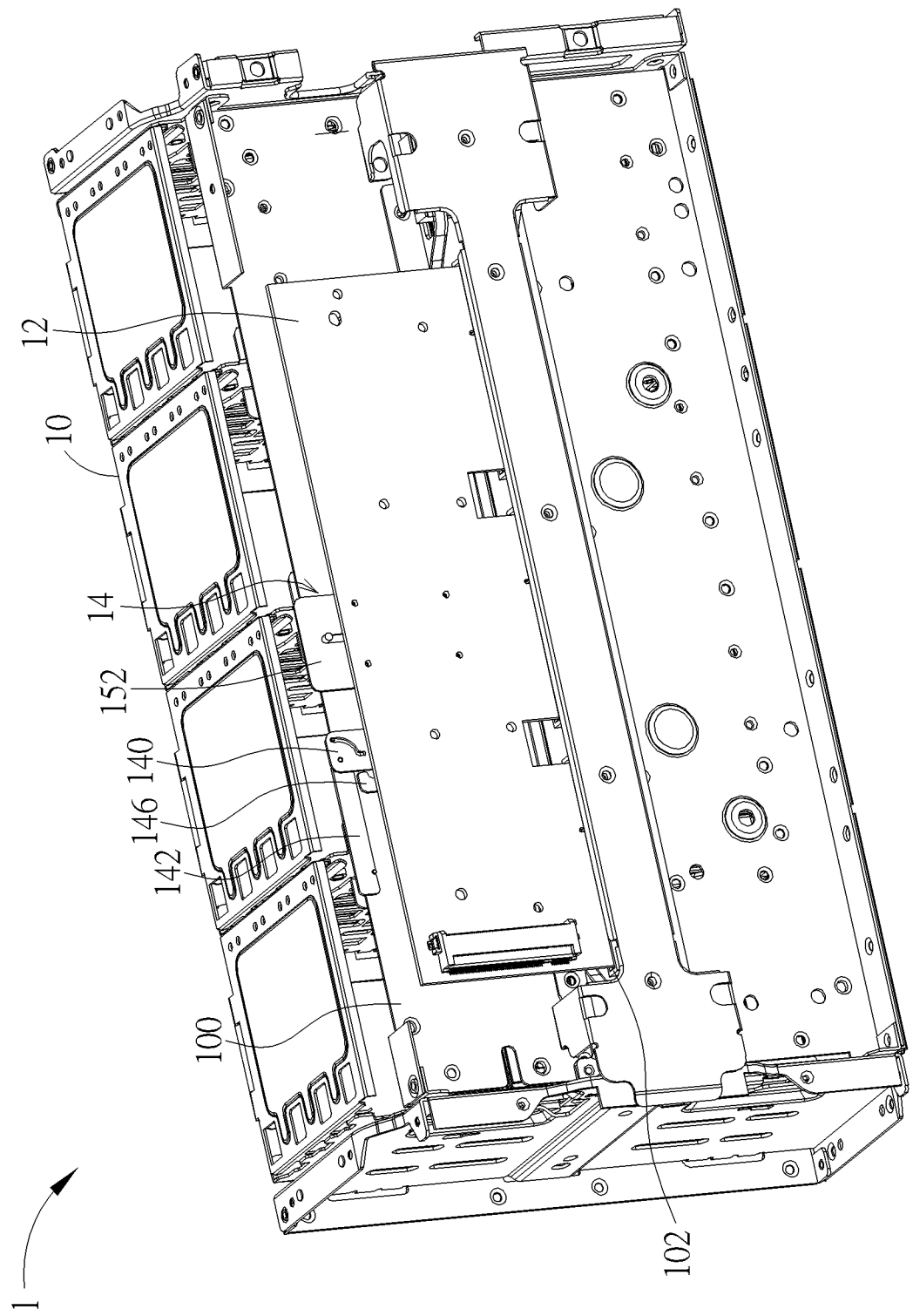
FIG. 1 is a perspective view illustrating an electronic device according to an embodiment of the invention.
Figure 2:
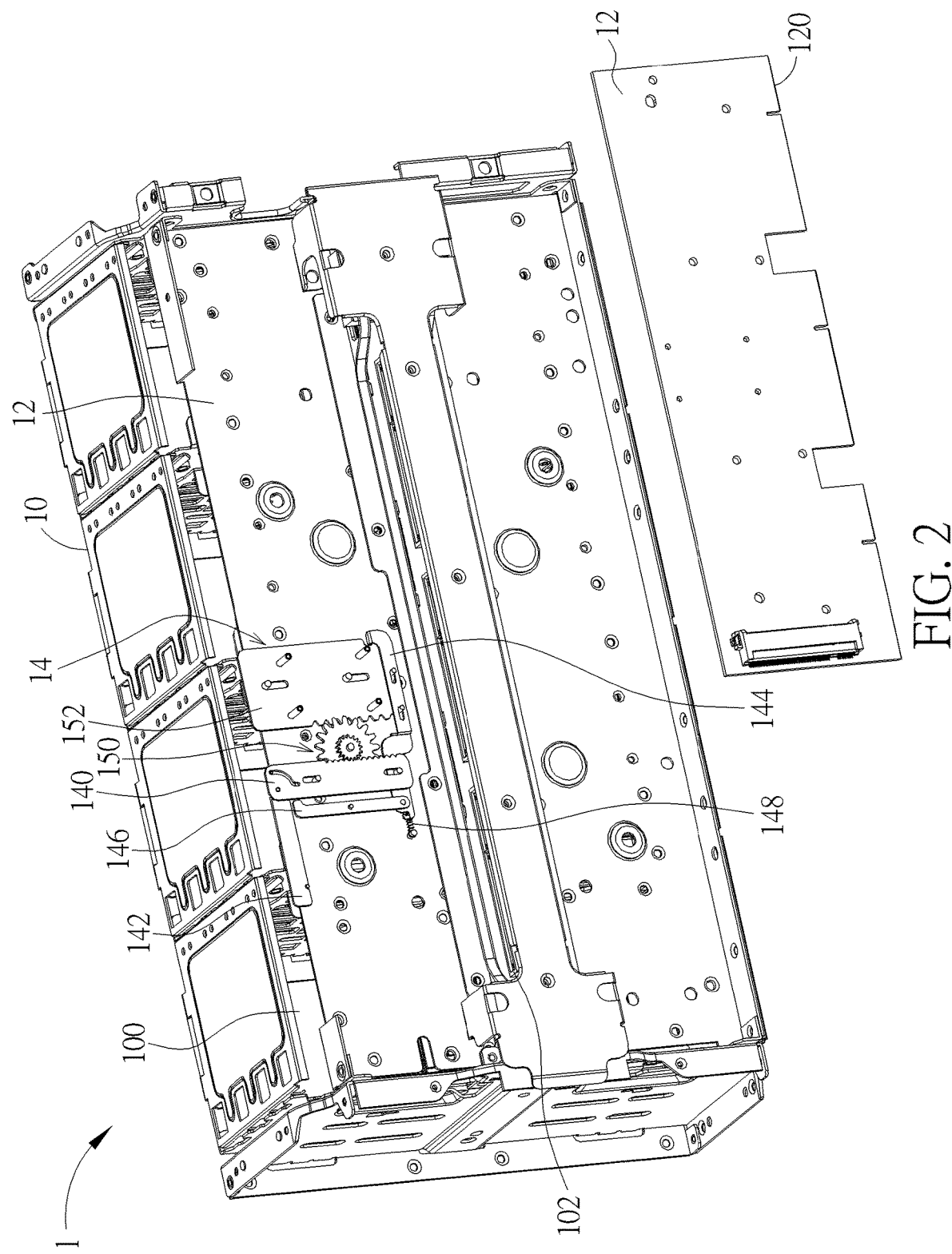
FIG. 2 is a perspective view illustrating the electronic component shown in FIG. 1 being detached.
Figure 3:
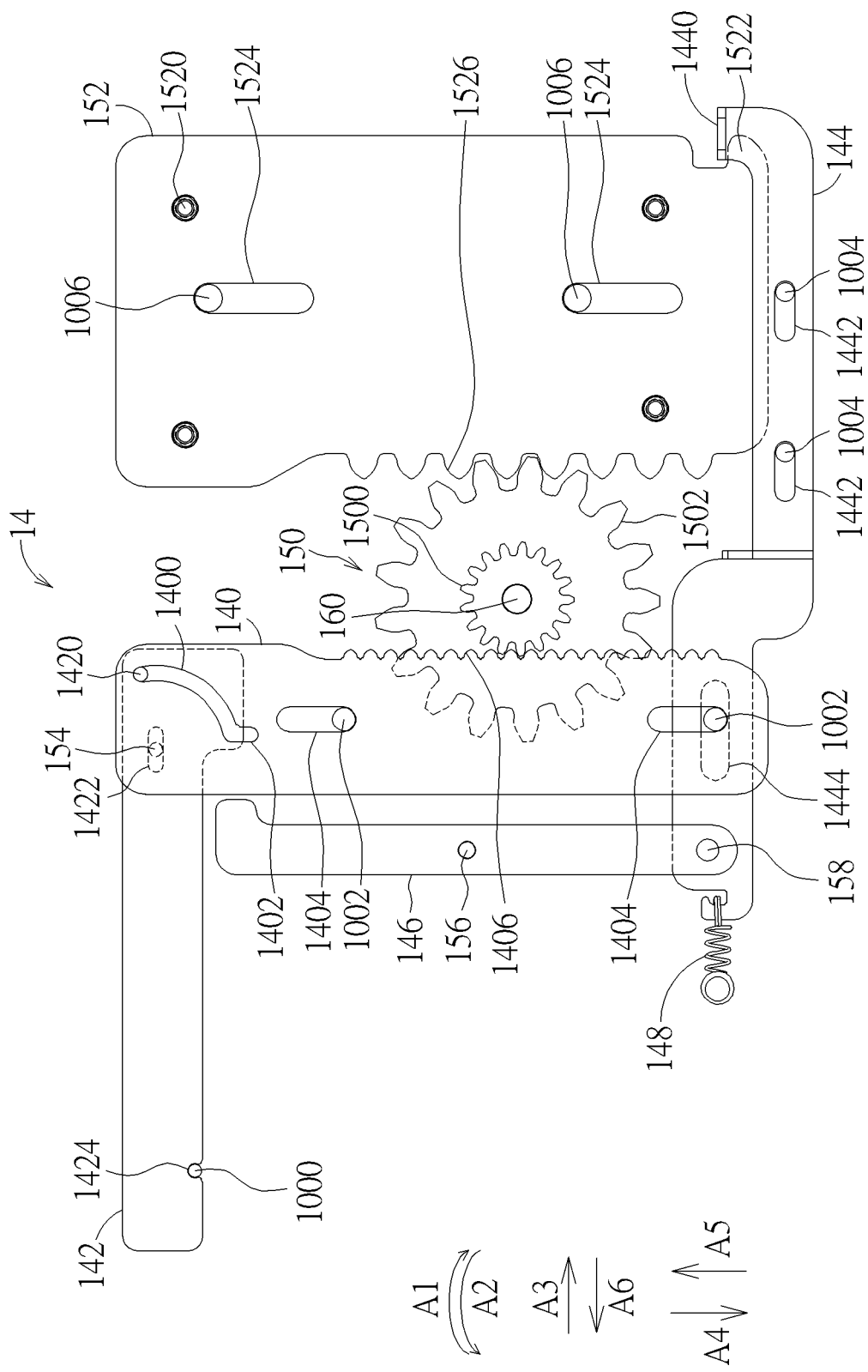
FIG. 3 is a front view illustrating the driving mechanism shown in FIG. 2.
Figure 4:
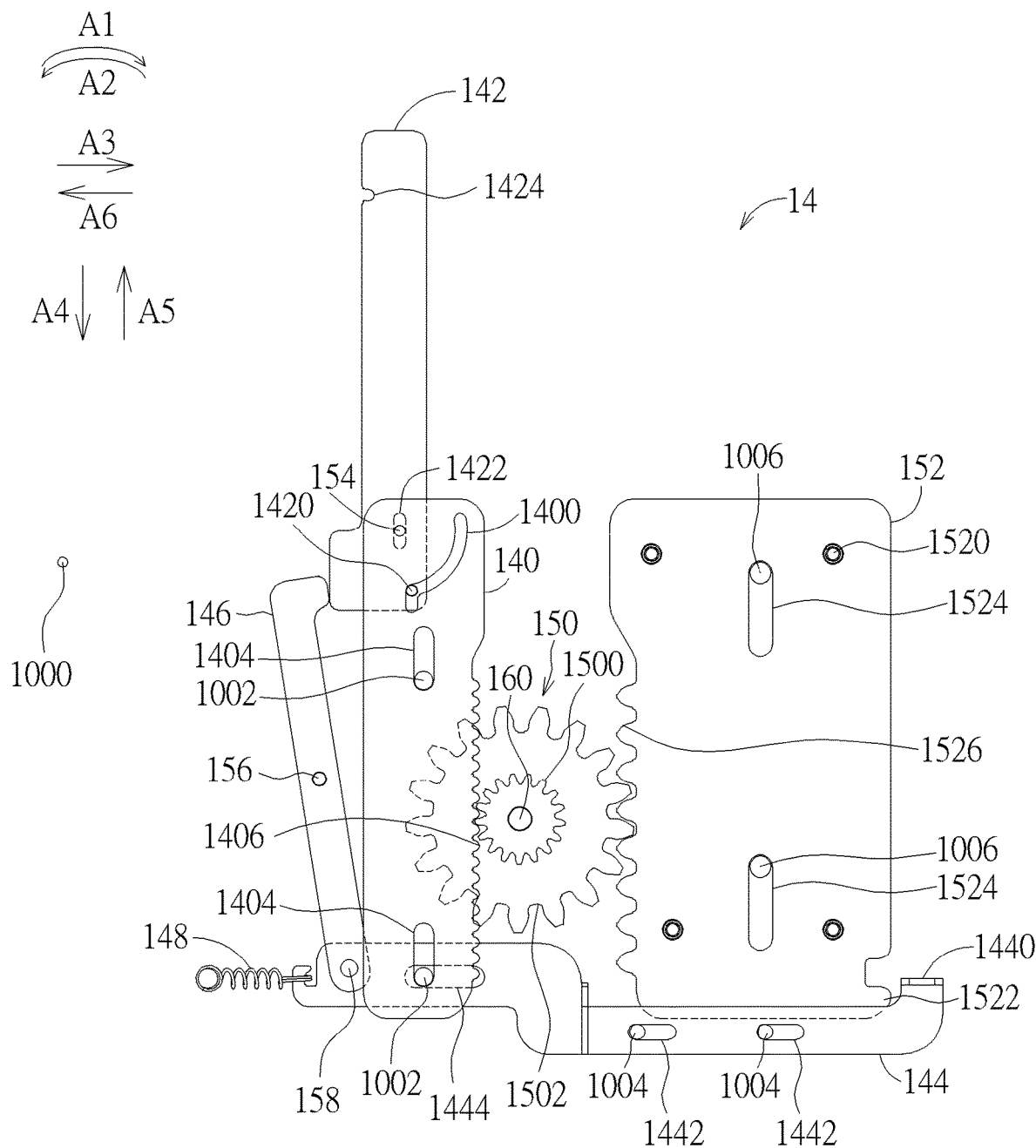
FIG. 4 is a front view illustrating the actuating member shown in FIG. 3 being rotated.
Figure 5:
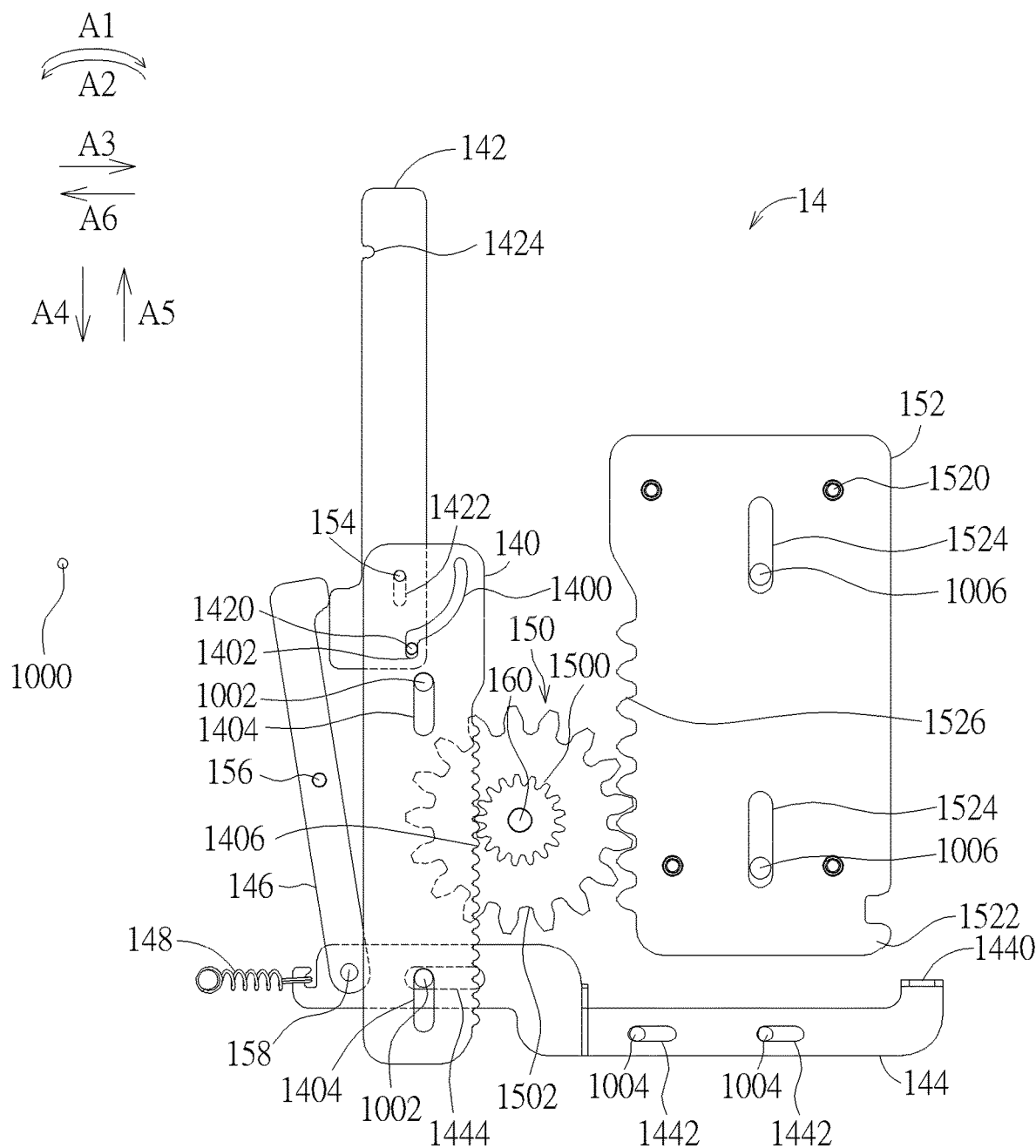
FIG. 5 is a front view illustrating the actuating member shown in FIG. 4 being pressed downwardly.

Referring to FIGS. 1 to 5, FIG. 1 is a perspective view illustrating an electronic device 1 according to an embodiment of the invention, FIG. 2 is a perspective view illustrating the electronic component 12 shown in FIG. 1 being detached, FIG. 3 is a front view illustrating the driving mechanism 14 shown in FIG. 2, FIG. 4 is a front view illustrating the actuating member 142 shown in FIG. 3 being rotated, and FIG. 5 is a front view illustrating the actuating member 142 shown in FIG. 4 being pressed downwardly.

As shown in FIGS. 1 and 2, the electronic device 1 comprises a chassis 10, an electronic component 12 and a driving mechanism 14. In practical applications, the electronic device 1 may be a server, and the chassis 10, the electronic component 12 and the driving mechanism 14 may be disposed in a casing of the server. In this embodiment, the chassis 10 may be used to accommodate a plurality of hard discs and the electronic component 12 may be a link control card (LCC) for managing the hard discs, but is not so limited. In another embodiment, the chassis 10 may be used to accommodate other electronic components and the electronic component 12 may be other interface cards or components according to practical applications.

The chassis 10 comprises a side plate 100 and the driving mechanism 14 is disposed on the side plate 100. As shown in FIG. 3, the driving mechanism 14 comprises a first linking member 140, an actuating member 142, a restraining member 144, a second linking member 146, an elastic member 148, a driving module 150 and a support member 152. The electronic component 12 is disposed on the support member 152. In this embodiment, the invention may use screws to fix the electronic component 12 on a plurality of support pillars 1520 of the support member 152. In another embodiment, the invention may use elastic hooks or other fixing structures to fix the electronic component 12 on the support member 152.

The first linking member 140 comprises a curved groove 1400, a restraining groove 1402 and a sliding groove 1404, wherein the restraining groove 1402 is connected to the curved groove 1400. The actuating member 142 comprises a protruding portion 1420, a sliding groove 1422 and an engaging recess 1424. The actuating member 142 may be pivotally connected to the first linking member 140 by a pivot 154 and the pivot 154 is located in the sliding groove 1422. Furthermore, the protruding portion 1420 of the actuating member 142 is disposed in the curved groove 1400 of the first linking member 140.

The restraining member 144 comprises a first restraining portion 1440. The second linking member 146 may be pivotally connected to the side plate 100 of the chassis 10 by a pivot 156 and pivotally connected to the restraining member 144 by another pivot 158. Opposite ends of the elastic member 148 are connected to the side plate 100 of the chassis 10 and the restraining member 144, respectively. In this embodiment, the elastic member 148 may be a spring. The driving module 150 is connected to the first linking member 140 and the support member 152 is connected to the driving module 150. The support member 152 comprises a second restraining portion 1522.

The side plate 100 of the chassis 10 comprises an engaging portion 1000. When the driving mechanism 14 has been assembled and situated in the state shown in FIG. 3, the engaging recess 1424 of the actuating member 142 engages with the engaging portion 1000 of the side plate 100 and the first restraining portion 1440 of the restraining member 144 engages with the second restraining portion 1522 of the support member 152, such that the support member 152 is restrained by the restraining member 144. At this time, the support member 152 and the electronic component 12 disposed on the support member 152 are fixed and cannot move.

In this embodiment, the side plate 100 of the chassis 10 further comprises two first positioning portions 1002, two second positioning portions 1004 and two third positioning portions 1006, the first linking member 140 further comprises two first positioning grooves 1404, the restraining member 144 further comprises two second positioning grooves 1442 and a sliding groove 1444, and the support member 152 further comprising two third positioning grooves 1524. The two first positioning portions 1002 of the side plate 100 are disposed in the two first positioning grooves 1404 of the first linking member 140, respectively. It should be noted that the first positioning portion 1002 located at the bottom of FIG. 3 is further disposed in the sliding groove 1444 of the restraining member 144, such that the first positioning portion 1002 does not hinder the restraining member 144 from moving. Furthermore, the two second positioning portions of the side plate 100 are disposed in the two second positioning grooves 1442 of the restraining member 144, respectively. Still further, the two third positioning portions 1006 of the side plate 100 are disposed in the two third positioning grooves 1524 of the support member 152, respectively. Accordingly, the first linking member 140, the restraining member 144 and the support member 152 can be positioned at the location shown in FIG. 3. It should be noted that the number of the first positioning portions 1002, the second positioning portions 1004, the third positioning portions 1006, the first positioning grooves 1404, the second positioning grooves 1442 and the third positioning grooves 1524 may be one or more according to practical applications.

In this embodiment, the driving module 150 may comprise a first gear 1500 and a second gear 1502, wherein the first gear 1500 and the second gear 1502 are coaxial gears. That is to say, the first gear 1500 and the second gear 1502 may be fixed on one single pivot 160, such that the first gear 1500 and the second gear 1502 can rotate synchronously. Furthermore, the first linking member 140 further comprises a first rack 1406 and the first rack 1406 meshes with the first gear 1500. Moreover, the support member 152 further comprises a second rack 1526 and the second rack 1526 meshes with the second gear 1502.

When a user wants to detach the electronic component 12, the user rotates the actuating member 142 in a first direction A1, such that the engaging recess 1424 of the actuating member 142 is disengaged from the engaging portion 1000 of the side plate 100. As shown in FIG. 4, when the actuating member 142 rotates in the first direction A1, the actuating member 142 drives the second linking member 146 to rotate with respect to the restraining member 144 in a second direction A2 and the second linking member 146 drives the restraining member 144 to move in a third direction A3, such that the first restraining portion 1440 of the restraining member 144 is disengaged from the second restraining portion 1522 of the support member 152. At this time, the elastic member 148 is stretched by the restraining member 144 in the third direction A3.

Then, the user presses the actuating member 142 downwardly in a fourth direction A4, such that the actuating member 142 drives the first linking member 140 to move in the fourth direction A4. As shown in FIG. 5, when the actuating member 142 drives the first linking member 140 to move in the fourth direction A4, the first rack 1406 of the first linking member 140 actuates the first gear 1500 to rotate in the second direction A2 and the second gear 1502 rotates together with the first gear 1500 in the second direction A2, such that the second gear 1502 drives the support member 152 to move in a fifth direction A5. At this time, the electronic component 12 moves together with the support member 152 to a user operable region (e.g. a region over the chassis 10 or a region with large space). Accordingly, the user can attach/detach the electronic component 12 to/from the support member 152 conveniently and rapidly. In this embodiment, the first direction A1 is opposite to the second direction A2, the third direction A3 is perpendicular to the fourth direction A4 and the fifth direction A5, and the fourth direction A4 is opposite to the fifth direction A5. It should be noted that a diameter of the first gear 1500 may be smaller than a diameter of the second gear 1502, such that the user may save strength and a moving distance of the support member 152 in the fifth direction may be enlarged when the user presses the actuating member 142 downwardly in the fourth direction A4.

Furthermore, as shown in FIG. 5, when the actuating member 142 drives the first linking member 140 to move in the fourth direction A4, the pivot 154 slides in the sliding groove 1422 of the actuating member 142 and the protruding portion 1420 of the actuating member 142 enters the restraining groove 1402 from the curved groove 1400 of the first linking member 140. Accordingly, the invention can prevent the actuating member 142 from rotating in the second direction A2 to return to the original position and also prevent the restraining member 144 from being pulled by an elastic force of the elastic member 148 in a sixth direction A6 to return to the original position. In this embodiment, the sixth direction A6 is opposite to the third direction A3.

When the first linking member 140, the restraining member 144 and the support member 152 are moving, the first positioning portions 1002, the second positioning portions 1004 and the third positioning portions 1006 are capable of sliding in the first positioning grooves 1406, the second positioning grooves 1442 and the third positioning grooves 1524, respectively, such that the first linking member 140, the restraining member 144 and the support member 152 keep moving linearly.

As shown in FIGS. 1 and 2, the electronic component 12 may comprise at least one electric connector 120 (e.g. golden finger connector) and the chassis 10 may comprise at least one slot 102 correspondingly. Therefore, when the support member 152 moves to the position shown in FIG. 5, the electronic component 12 moves together with the support member 152, such that the electric connector 120 comes off the slot 102. After attaching the electronic component 12 to the support member 152 shown in FIG. 5, the user pulls the actuating member 142 in the fifth direction A5, such that the actuating member 142 drives the first linking member 140 to move in the fifth direction A5 to the position shown in FIG. 4. At this time, the first rack 1406 of the first linking member 140 actuates the first gear 1500 to rotate in the first direction A1 and the second gear 1502 rotates together with the first gear 1500 in the first direction A1, such that the second gear 1502 drives the support member 152 to move in the fourth direction A4. The electronic component 12 moves together with the support member 152 in the fourth direction A4, such that the electric connector 120 is inserted into the slot 102. Then, the user rotates the actuating member 142 in the second direction A2 to the position shown in FIG. 3, such that the engaging recess 1424 of the actuating member 142 engages with the engaging portion 1000 of the side plate 100. At the same time, the elastic force of the elastic member 148 pulls the restraining member 144 in the sixth direction A6 to return to the original position, such that the first restraining portion 1440 of the restraining member 144 engages with the second restraining portion 1522 of the support member 152 (i.e. the support member 152 is restrained by the restraining member 144). Accordingly, the support member 152 and the electronic component 12 disposed on the support member 152 are fixed and cannot move.

Figure 6:
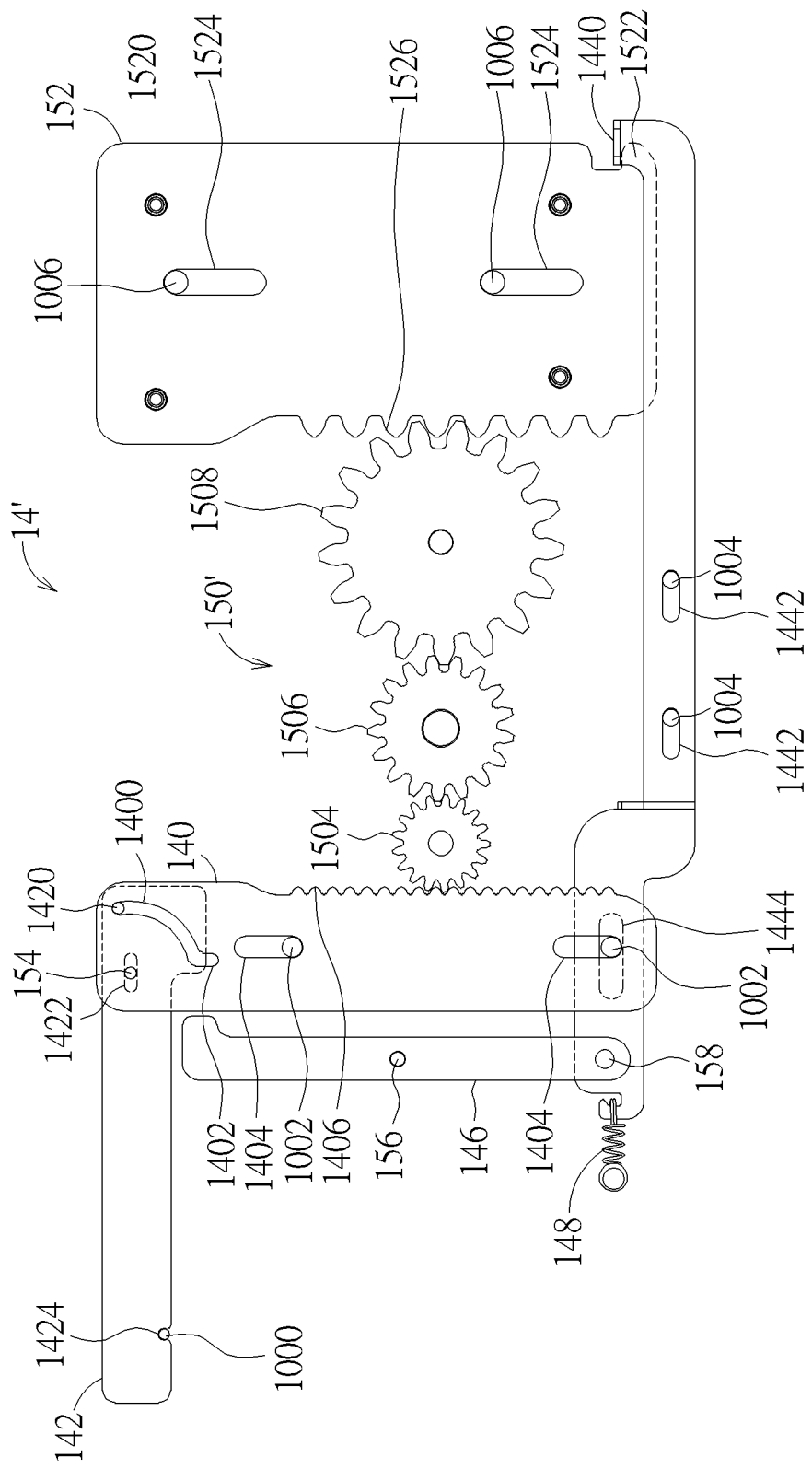
FIG. 6 is a front view illustrating a driving mechanism according to another embodiment of the invention.

Referring to FIG. 6, FIG. 6 is a front view illustrating a driving mechanism 14' according to another embodiment of the invention. The main difference between the driving mechanism 14' and the aforesaid driving mechanism 14 is that the driving module 150' of the driving mechanism 14' comprises a first gear 1504, a second gear 1506 and a third gear 1508. As shown in FIG. 6, the first rack 1406 of the first linking member 140 meshes with the first gear 1504, the first gear 1504 meshes with the second gear 1506, the second gear 1506 meshes with the third gear 1508, and the second rack 1526 of the support member 152 meshes with the third gear 1508. In this embodiment, the first linking member 140 drives the support member 152 to move by means of the cooperation between the first gear 1504, the second gear 1506 and the third gear 1508. It should be noted that the same elements in FIG. 6 and FIGS. 3-5 are represented by the same numerals, so the repeated explanation will not be depicted herein again.

Figure 7:
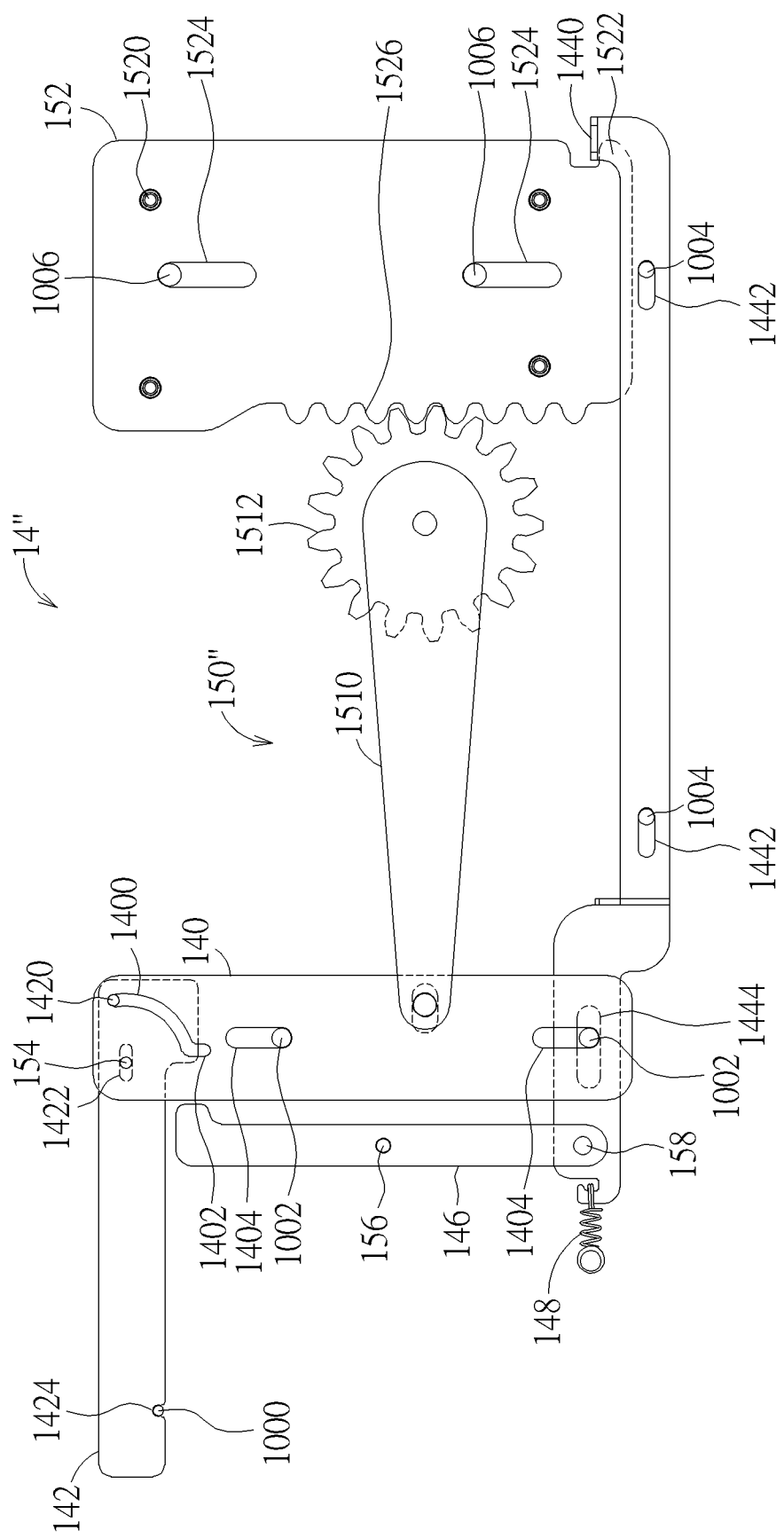
FIG. 7 is a front view illustrating a driving mechanism according to another embodiment of the invention.

Referring to FIG. 7, FIG. 7 is a front view illustrating a driving mechanism 14" according to another embodiment of the invention. The main difference between the driving mechanism 14" and the aforesaid driving mechanism 14 is that the driving module 150' of the driving mechanism 14' comprises a linking bar 1510 and a gear 1512. As shown in FIG. 7, the linking bar 1510 is connected to the first linking member 140 and the gear 1512, and the rack 1526 of the support member 152 meshes with the gear 1512. In this embodiment, the first linking member 140 drives the support member 152 to move by means of the cooperation between the linking bar 1510 and the gear 1512. It should be noted that the same elements in FIG. 7 and FIGS. 3-5 are represented by the same numerals, so the repeated explanation will not be depicted herein again.

Figure 8:
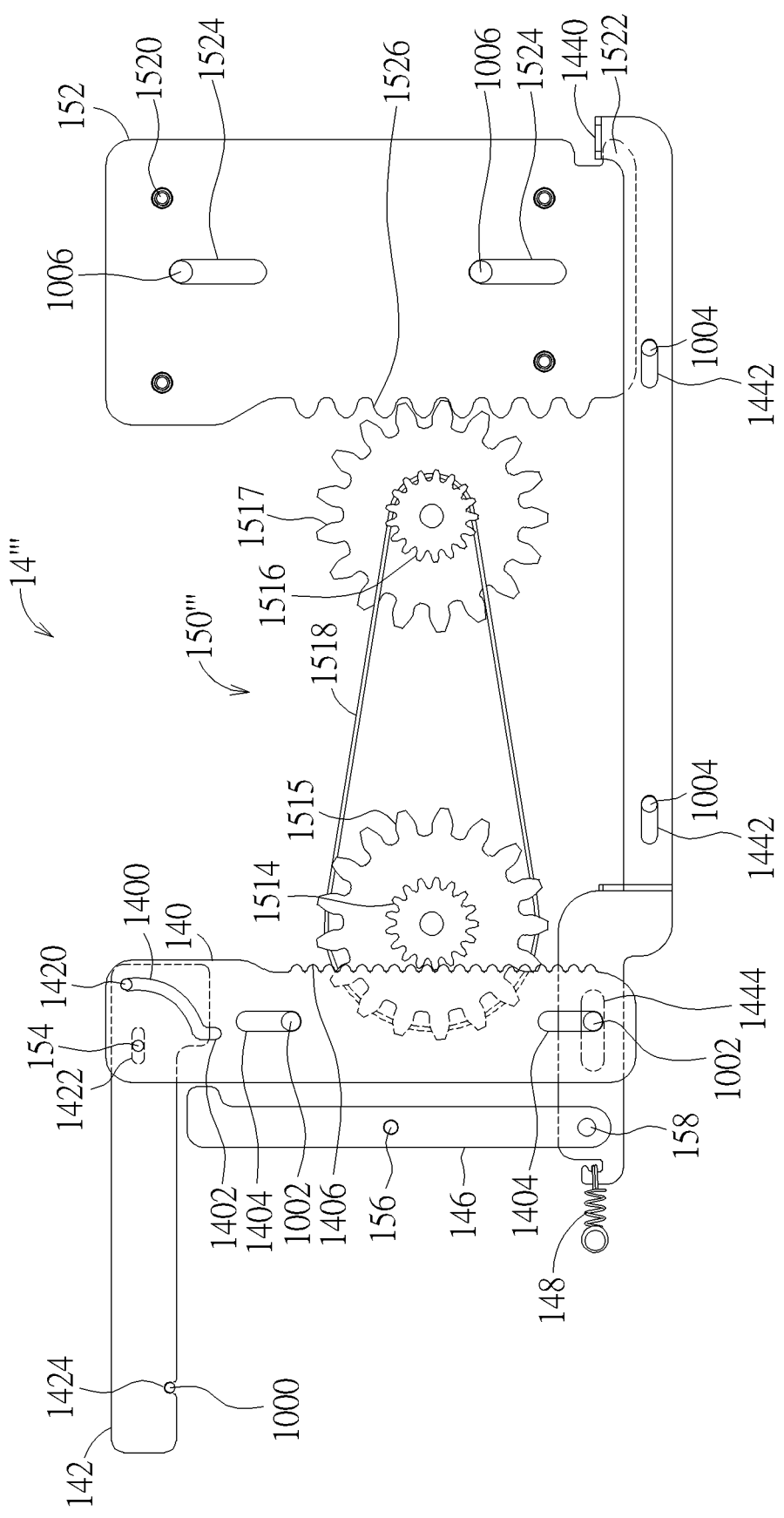
FIG. 8 is a front view illustrating a driving mechanism according to another embodiment of the invention.

Referring to FIG. 8, FIG. 8 is a front view illustrating a driving mechanism 14''' according to another embodiment of the invention. The main difference between the driving mechanism 14''' and the aforesaid driving mechanism 14 is that the driving module 150''' of the driving mechanism 14''' comprises a first gear 1514, a second gear 1515, a third gear 1516, a fourth gear 1517 and a transmission belt 1518. As shown in FIG. 8, the first gear 1514 and the second gear 1515 are coaxial gears, and the third gear 1516 and the fourth gear 1517 are coaxial gears. The first rack 1406 of the first linking member 140 meshes with the first gear 1514, the transmission belt 1518 is connected to the second gear 1515 and the third gear 1516, and the second rack 1526 of the support member 152 meshes with the fourth gear 1517. In this embodiment, the first linking member 140 drives the support member 152 to move by means of the cooperation between the first gear 1514, the second gear 1515, the third gear 1516, the fourth gear 1517 and the transmission belt 1518. It should be noted that the same elements in FIG. 8 and FIGS. 3-5 are represented by the same numerals, so the repeated explanation will not be depicted herein again.

As mentioned in the above, after assembling the driving mechanism of the invention, the first restraining portion of the restraining member engages with the second restraining portion of the support member (i.e. the support member is restrained by the restraining member), such that the support member and the electronic component (e.g. interface card) disposed on the support member are fixed and cannot move. When a user wants to attach or detach the electronic component, the user rotates the actuating member. At this time, the actuating member drives the second linking member to rotate and the second linking member drives the restraining member to move, such that the first restraining portion of the restraining member is disengaged from the second restraining portion of the support member. Then, the user presses the actuating member downwardly, such that the actuating member drives the first linking member to move. At this time, the first linking member actuates the driving module, such that the driving module drives the support member to move to a user operable region (e.g. a region over the chassis or a region with large space). Accordingly, the user can attach/detach the electronic component to/from the support member conveniently and rapidly.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An electronic device comprising:
a chassis comprising a side plate;
an electronic component; and
a driving mechanism disposed on the side plate, the driving mechanism comprising:
a first linking member;
an actuating member pivotally connected to the first linking member;
a restraining member;
a second linking member pivotally connected to the side plate and the restraining member;
a driving module connected to the first linking member; and
a support member connected to the driving module, the electronic component being disposed on the support member, the support member being restrained by the restraining member;
wherein the actuating member drives the second linking member to rotate with respect to the restraining member and the second linking member drives the restraining member to move, such that the restraining member is disengaged from the support member.

2. The electronic device of claim 1, wherein when the actuating member rotates in a first direction, the actuating member drives the second linking member to rotate in a second direction and the second linking member drives the restraining member to move in a third direction, such that the restraining member is disengaged from the support member; when the actuating member drives the first linking member to move in a fourth direction, the first linking member actuates the driving module, such that the driving module drives the support member to move in a fifth direction; the first direction is opposite to the second direction, the third direction is perpendicular to the fourth direction and the fifth direction, and the fourth direction is opposite to the fifth direction.

3. The electronic device of claim 2, wherein the first linking member comprises a curved groove and a restraining groove, the restraining groove is connected to the curved groove, the actuating member comprises a protruding portion, and the protruding portion is disposed in the curved groove; when the actuating member drives the first linking member to move in the fourth direction, the protruding portion enters the restraining groove from the curved groove.

4. The electronic device of claim 1, wherein the actuating member comprises an engaging recess, the side plate comprises an engaging portion, and the engaging recess engages with the engaging portion.

5. The electronic device of claim 1, wherein the restraining member comprises a first restraining portion, the support member comprises a second restraining portion, and the first restraining portion engages with the second restraining portion, such that the support member is restrained by the restraining member.

6. The electronic device of claim 1, wherein the driving mechanism further comprises an elastic member connected to the side plate and the restraining member.

7. The electronic device of claim 1, wherein the driving module comprises a first gear and a second gear, the first gear and the second gear are coaxial gears, the first linking member comprises a first rack, the first rack meshes with the first gear, the support member comprises a second rack, and the second rack meshes with the second gear.

8. The electronic device of claim 1, wherein the driving module comprises a first gear, a second gear and a third gear, the first gear meshes with the second gear, the second gear meshes with the third gear, the first linking member comprises a first rack, the first rack meshes with the first gear, the support member comprises a second rack, and the second rack meshes with the third gear.

9. The electronic device of claim 1, wherein the driving module comprises a linking bar and a gear, the linking bar is connected to the first linking member and the gear, the support member comprises a rack, and the rack meshes with the gear.

10. The electronic device of claim 1, wherein the driving module comprises a first gear, a second gear, a third gear, a fourth gear and a transmission belt, the first gear and the second gear are coaxial gears, the third gear and the fourth gear are coaxial gears, the first linking member comprises a first rack, the first rack meshes with the first gear, the transmission belt is connected to the second gear and the third gear, the support member comprises a second rack, and the second rack meshes with the fourth gear.

11. A driving mechanism comprising:
a first linking member;
an actuating member pivotally connected to the first linking member;
a restraining member;
a second linking member pivotally connected to the restraining member;
a driving module connected to the first linking member; and
a support member connected to the driving module, the support member being restrained by the restraining member;
wherein the actuating member drives the second linking member to rotate with respect to the restraining member and the second linking member drives the restraining member to move, such that the restraining member is disengaged from the support member.

12. The driving mechanism of claim 11, wherein when the actuating member rotates in a first direction, the actuating member drives the second linking member to rotate in a second direction and the second linking member drives the restraining member to move in a third direction, such that the restraining member is disengaged from the support member; when the actuating member drives the first linking member to move in a fourth direction, the first linking member actuates the driving module, such that the driving module drives the support member to move in a fifth direction; the first direction is opposite to the second direction, the third direction is perpendicular to the fourth direction and the fifth direction, and the fourth direction is opposite to the fifth direction.

13. The driving mechanism of claim 12, wherein the first linking member comprises a curved groove and a restraining groove, the restraining groove is connected to the curved groove, the actuating member comprises a protruding portion, and the protruding portion is disposed in the curved groove; when the actuating member drives the first linking member to move in the fourth direction, the protruding portion enters the restraining groove from the curved groove.

14. The driving mechanism of claim 11, wherein the driving mechanism is disposed on a side plate, the actuating member comprises an engaging recess, the side plate comprises an engaging portion, and the engaging recess engages with the engaging portion.

15. The driving mechanism of claim 11, wherein the restraining member comprises a first restraining portion, the support member comprises a second restraining portion, and the first restraining portion engages with the second restraining portion, such that the support member is restrained by the restraining member.

16. The driving mechanism of claim 11, further comprising an elastic member connected to the restraining member.

17. The driving mechanism of claim 11, wherein the driving module comprises a first gear and a second gear, the first gear and the second gear are coaxial gears, the first linking member comprises a first rack, the first rack meshes with the first gear, the support member comprises a second rack, and the second rack meshes with the second gear.

18. The driving mechanism of claim 11, wherein the driving module comprises a first gear, a second gear and a third gear, the first gear meshes with the second gear, the second gear meshes with the third gear, the first linking member comprises a first rack, the first rack meshes with the first gear, the support member comprises a second rack, and the second rack meshes with the third gear.

19. The driving mechanism of claim 11, wherein the driving module comprises a linking bar and a gear, the linking bar is connected to the first linking member and the gear, the support member comprises a rack, and the rack meshes with the gear.

20. The driving mechanism of claim 11, wherein the driving module comprises a first gear, a second gear, a third gear, a fourth gear and a transmission belt, the first gear and the second gear are coaxial gears, the third gear and the fourth gear are coaxial gears, the first linking member comprises a first rack, the first rack meshes with the first gear, the transmission belt is connected to the second gear and the third gear, the support member comprises a second rack, and the second rack meshes with the fourth gear.

* * * * *